United States Patent [19]

Stone

[11] Patent Number: 5,764,107
[45] Date of Patent: Jun. 9, 1998

[54] HIGHLY RESPONSIVE AUTOMATIC OUTPUT POWER CONTROL BASED ON A DIFFERENTIAL AMPLIFIER

[75] Inventor: Richard M. Stone, Suwanee, Ga.

[73] Assignee: Matsushita Communication Industrial Corporation of America, Peachtree City, Ga.

[21] Appl. No.: 697,572

[22] Filed: Aug. 27, 1996

Related U.S. Application Data

[60] Provisional application No. 60/002,943 Aug. 30, 1995.
[51] Int. Cl.[6] ..................................................... H03G 3/30
[52] U.S. Cl. ........................................... 330/279; 330/140
[58] Field of Search ................................. 330/129, 136, 330/278, 279, 281, 140, 141

[56] References Cited

U.S. PATENT DOCUMENTS

| | | | |
|---|---|---|---|
| 4,523,155 | 6/1985 | Walczak et al. | 330/279 |
| 4,992,753 | 2/1991 | Jenson et al. | 330/129 |
| 5,337,006 | 8/1994 | Miyazaki | 330/279 X |
| 5,337,020 | 8/1994 | Daughtry et al. | 330/279 |
| 5,367,268 | 11/1994 | Baba | 330/129 |

FOREIGN PATENT DOCUMENTS

| | | |
|---|---|---|
| 0 481 524 A2 | 4/1992 | European Pat. Off. . |
| WO 92/22134 | 12/1992 | WIPO . |

Primary Examiner—Steven Mottola
Attorney, Agent, or Firm—Jones & Askew

[57] ABSTRACT

A circuit for automatically limiting fluctuations in the output power level of a transmitter by providing a feedback control signal which is based on the output power level. An RF signal (100) is input to a terminal of the RF detector (200). When the RF signal (100) is more negative than a bias voltage (209), a capacitor (208) begins charging. When the RF signal (100) becomes more positive than the bias voltage (209), the voltage in the charged capacitor (208) is added to the RF signal (100) and then averaged by the capacitors (214 and 206) to form voltage VE. Voltage VE in conjunction with the current setting circuitry (230) establishes a tail current (235) which is comprised of transistor (216) current (225) and the current from the RF detector (200). The tail current (235) tends to remain constant whereas the transistor current (225) is responsive to power changes in the RF signal (100) and represents the difference between the output power level of the RF power amplifier and the specified reference (110). The current (235) is amplified by current amplifier (220) to provide the feedback control signal (120). Thus, when the power of RF signal (100) increases, transistor current (225) decreases. This causes the feedback control signal to decrease the output of the RF power amplifier. Likewise, when the power of the RF signal (100) decreases, transistor current (225) increases. This causes the feedback control signal to increase the output of the RF power amplifier.

8 Claims, 4 Drawing Sheets

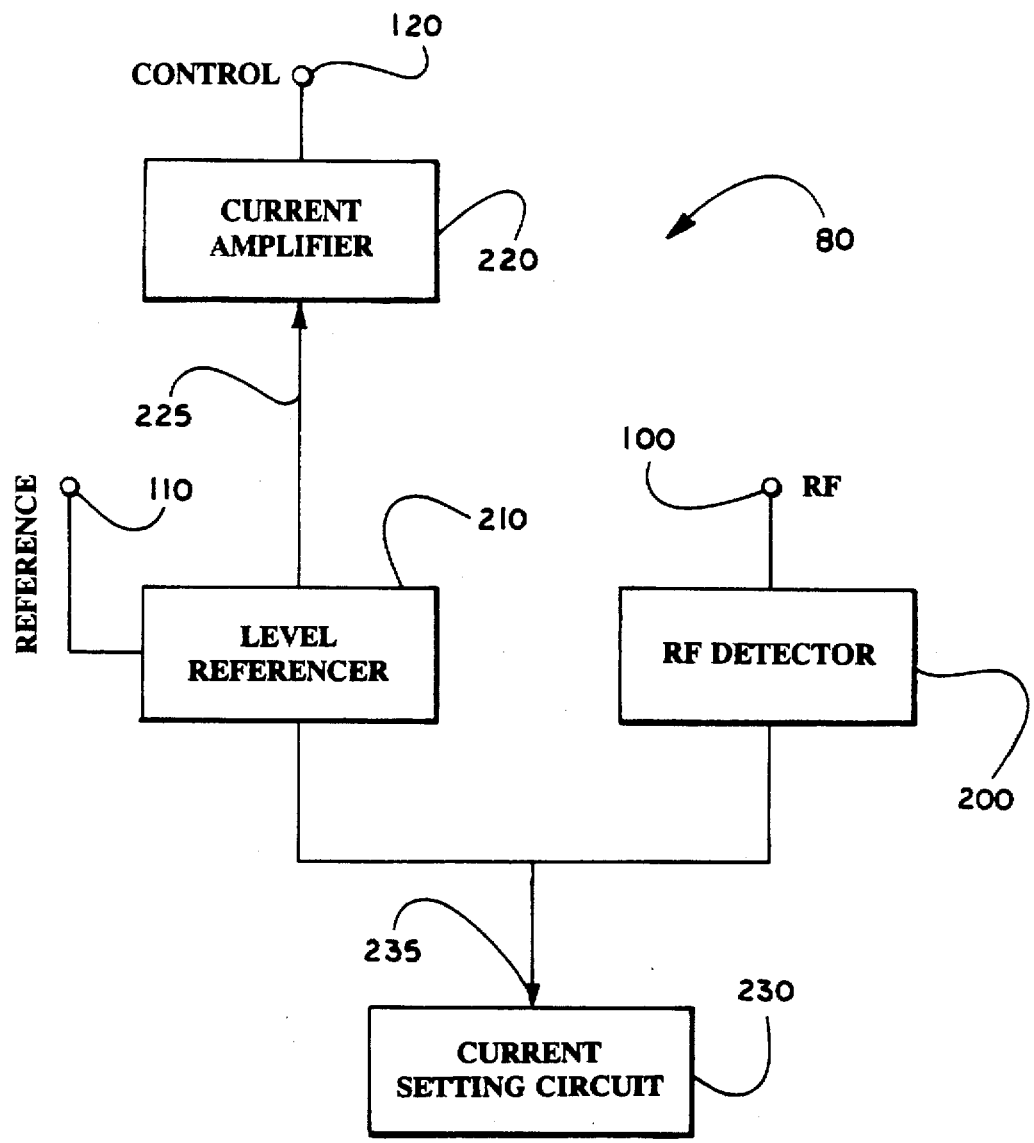
Fig_2

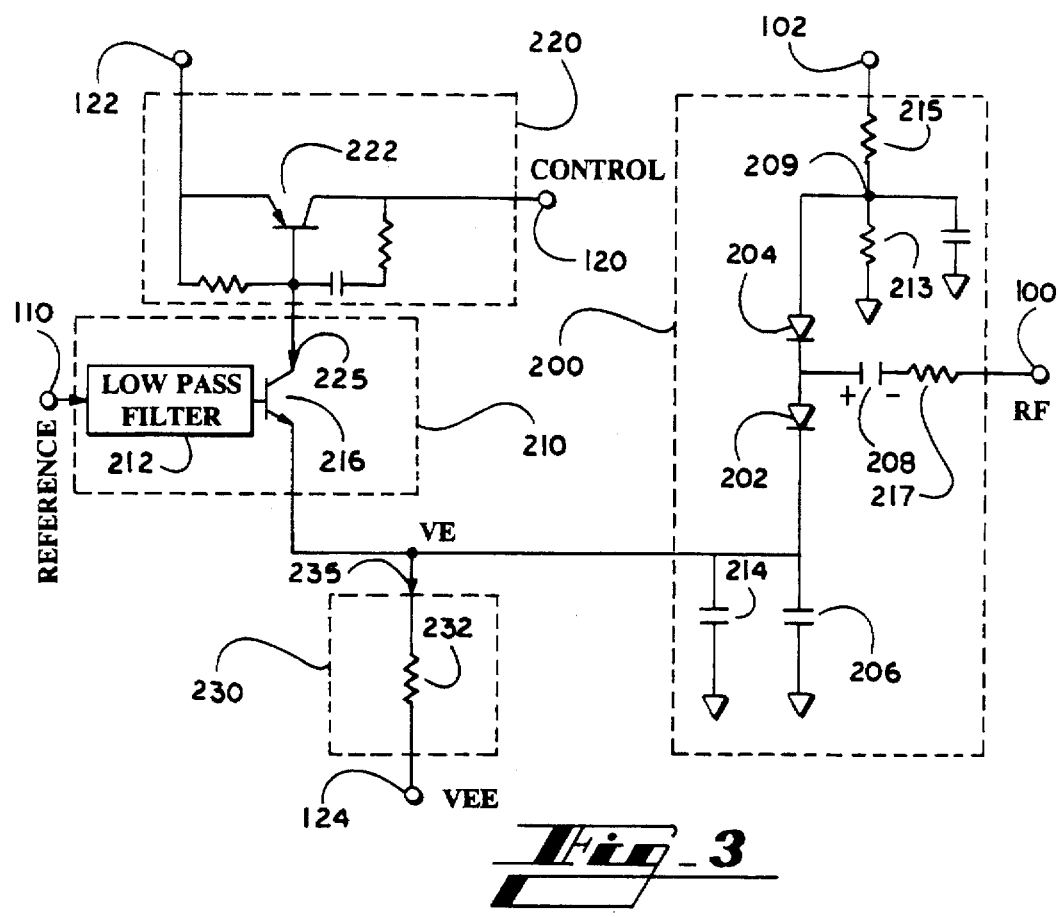
Fig_3
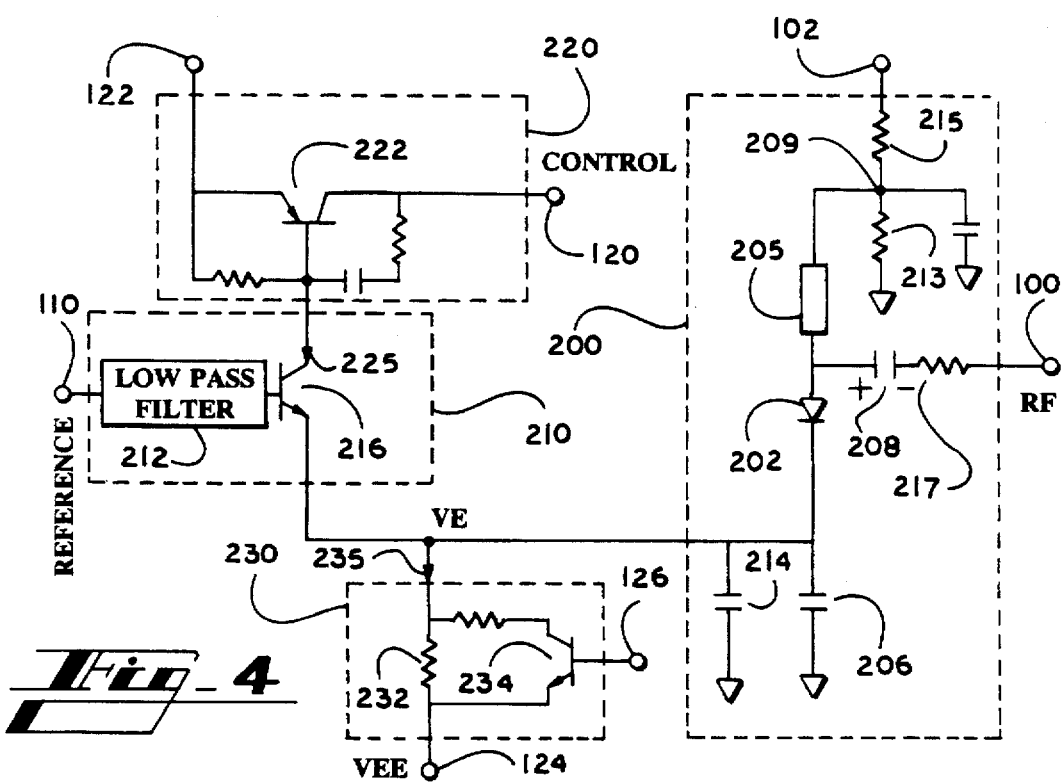
Fig_4

HIGHLY RESPONSIVE AUTOMATIC OUTPUT POWER CONTROL BASED ON A DIFFERENTIAL AMPLIFIER

This application claims the priority of U.S. Provisional application Ser. No. 60/002,943 filed on Aug. 30, 1995.

TECHNICAL FIELD

This invention relates generally to the control of the output power level of a radio frequency amplifier, and more specifically, to an automatic power level control circuit that accurately maintains a stable output power over a wide range of temperatures.

BACKGROUND OF THE INVENTION

In compliance with industry specifications, cellular telephones must conform to one of three classes, Class I, II or III. These classes are differentiated by the nominal effective radiated power ("ERP") of the cellular telephone with respect to a half-wave dipole. In addition, each cellular telephone in a class must be able to operate at one of a plurality of radio frequency ("RF") output power levels. The output power level of the cellular telephone is determined by the cellular system. The cellular system monitors the traffic and the received power levels from the cellular telephones within the system, and then transmits power level setting commands to the cellular telephones. By limiting the output power level of the cellular telephones to that needed for effective communication, the cellular system can minimize the amount of inter-cell interference and hence, maximize the channel capacity within the system. In order to accomplish this, cellular telephones must be capable of accurately maintaining the system-selected output power level within specified tolerances over a wide range of environmental conditions.

In most cases, RF transmitters maintain the output power level at a selected level by utilizing a feedback loop. The feedback loop monitors the current output power level and detects and adjusts for slight changes in the output power level from the selected level. This process consists of detecting the output power level from an RF power amplifier and converting it into a signal having a magnitude which corresponds to the output power level. The magnitude of this signal is then compared to a reference signal which corresponds to the selected level. The difference between the detected signal and the reference signal is called an error detection signal and is used as a feedback control signal to adjust the output power level from the power amplifier to the selected level.

Typically, the output power level detection and conversion is accomplished by employment of a diode (or equivalent P-N junction semiconductor) detector. The diode detector converts the detected RF output signal into a DC level which represents the magnitude of the RF output power. The accuracy of this type of detector is limited because the voltage drop across the diode is dependent upon the temperature. Thus, temperature changes can cause the RF output power level to fluctuate.

Various methods have been utilized to limit the effect of temperature fluctuations on the output power level. One method utilizes a second diode, having similar temperature characteristics to the first diode, in the circuitry that forward biases the first diode. This approach limits the effect that the temperature variation has on the DC voltage level generated. An example of this method is described in U.S. Pat. No. 4,523,155 to Walczak et al. One disadvantage to this method is that the process of selecting diodes with similar thermal characteristics is difficult and costly. Another disadvantage is that since the diodes are packaged separately, it is difficult to ensure that they are being subjected to the same thermal environment during operation.

A second method utilizes a comparator to generate the amplifier control signal. The signals input to the comparator include a reference signal which indicates what output power level has been selected by the system, and a signal representing the present output power level. The inputs to the comparator are connected to a common voltage level by using two diodes. By placing these two diodes in a substantially isothermal relationship, the effects due to variations in temperature are limited. An example of this method is described in U.S. Pat. No. 4,992,753 to Jenson et al. The circuit in Jenson is subject to some temperature induced variations because the diode detector is not thermally compensated and does not match the biasing diodes. In addition, the diode detector is not forward biased and will therefore exhibit non-linear characteristics at low output voltages.

A third method limits the temperature variations in the detector circuit by utilizing paired transistors connected in a differential configuration. Paired transistors are available in single packages with the transistors being formed on the same substrate. In this method, the output RF signal is applied to the base of one transistor in the pair (i.e. is detected across the P-N junction of this transistor), and the reference signal is input on the base of the second transistor. Both transistors are manufactured on the same substrate and packaged together so their operating environments and thermal characteristics are very similar and the effect of temperature variations is limited. An example of this method is described in U.S. Pat. No. 5,337,020 to Daughtry et al. The main disadvantage to this method is that the P-N junction of the transistor is not very efficient in the detection of the RF signal and thus, the detector is not sensitive to slight variations in the RF output signal. In addition, the size of the dual transistor package can complicate board layouts.

Thus, there is a need in the art for an improved RF detector for power level control that is: sensitive to slight changes in the output RF signal; inherently stable in the presence of variations in temperature or drift in circuit parameters; and consists of a simple, cost effective circuit.

There is also a need in the art for an improved RF detector that maintains some immunity to temperature fluctuations and yet is not burdened by the requirements of matching the temperature characteristics of diode pairs in order to provide this immunity.

SUMMARY OF THE INVENTION

The present invention overcomes the above described problems in prior art output control circuitry by providing a power level control circuit that is highly sensitive to slight changes in the RF output signal, is effectively immune to temperature induced variations and is easily manufactured.

Generally described, the present invention provides a circuit for providing an output control signal based on an input signal, such as generating a control signal that may be used to alter the output power of an RF power amplifier. The circuit includes a detector/amplifier having one input connected to a reference signal and another input functionally connected to the output of the power amplifier. The output of the detector/amplifier is a power level control signal indicating the difference between the reference signal and the RF output. The power level control signal is either applied to a second amplifier or fed directly to the input control line of the RF power amplifier. When the current of the power level control signal increases, the output of the RF power amplifier is increased. When the current of the power level control signal decreases, the output of the RF power amplifier is decreased.

More particularly described, the present invention provides a circuit wherein the detector/amplifier is essentially a differential amplifier with one branch of the amplifier composed of a transistor having a base, emitter, and a collector; and another branch of the amplifier having a detector circuit consisting of a diode and an isolator. The tail current of the differential amplifier is established by a current setting circuit. The current setting circuit consists of a parallel resistive and capacitive circuit. The tail current is divided between the two branches of the differential amplifier and tends to remain constant. Thus, changes in the current of one branch of the differential amplifier will inversely affect the current in the other branch.

In one embodiment of the present invention, the reference signal is input at the base of the transistor, the power level control signal is output from the collector of the transistor, and the diode detector is functionally connected to the output of the RF amplifier. The reference voltage is used to select from a plurality of desired output voltage levels by altering the current that passes through the transistor branch of the differential amplifier. Thus, when the reference voltage becomes more positive, the current through the transistor increases, resulting in an increase in the power level control signal. Likewise, when the reference voltage becomes more negative, the current through the transistor decreases, resulting in a decrease in the power level control signal. For a given reference signal, as the detected RF output power increases, the current through the diode branch of the differential amplifier increases and the current through the transistor branch decreases. This results in a decrease in the current of the power level control signal. Similarly, when the RF output power decreases, the current through the diode branch of the differential amplifier decreases and the current through the transistor branch increases. This operates to increase the power level control signal.

In another embodiment of the present invention, the reference signal is input to the current setting circuit. The reference voltage is used to select from a plurality of desired output voltage levels by altering the tail current, and hence, the current that passes through the transistor branch of the differential amplifier. In addition, the reference voltage operates to modify the dynamic range of the detector circuit by altering the current that passes through the diode branch of the differential amplifier. The reference voltage is at a potential which is less than the value of VE. Thus, when the reference voltage becomes more positive, the difference between VE and the reference voltage decreases and the current through the transistor decreases. This results in a decrease in the power level control signal. Likewise, when the reference voltage becomes more negative, the current through the transistor increases, resulting in an increase in the power level control signal. For a given reference signal, as the detected RF output power increases, the current through diode branch of the differential amplifier increases and the current through the transistor branch decreases. This results in a decrease in the power level control signal. Similarly, when the RF output power decreases, the current through the diode branch of the differential amplifier decreases and the current through the transistor branch increases. This operates to increase the power level control signal.

In another embodiment of the present invention, the reference signal is input to the diode detection circuit. The reference voltage is used to select from a plurality of desired output voltage levels by altering the current that passes through the diode branch of the differential amplifier. In addition, the reference voltage operates to modify the dynamic range of the detector circuit by altering the current that passes through the diode branch of the differential amplifier. Thus, when the reference voltage becomes more positive, the current through the diode branch increases, resulting in a decrease in the current through the transistor branch of the differential amplifier and a decrease in the power level control signal. Likewise, when the reference voltage becomes more negative, the current through the diode branch decreases, resulting in an increase in the current through the transistor branch of the differential amplifier and an increase in the power level control signal. For a given reference signal, as the detected RF output power increases, the current through diode branch of the differential amplifier increases and the current through the transistor branch decreases. This results in a decrease in the current of the power level control signal. Similarly, when the .RF output power decreases, the current through the diode branch of the differential amplifier decreases and the current through the transistor branch increases. This operates to increase the power level control signal.

In one variation of these embodiments, the diode detector is functionally connected to the RF output through a capacitor. The capacitor operates to store the magnitude of the detected output power level when the output power is more negative than a biasing voltage for the detector. When the detected output power level becomes more positive than the biasing voltage, the stored magnitude is combined with the detected output power level. This variation operates to increase the sensitivity of the detector to changes in the output RF signal.

In another variation of these embodiments, the current limiting circuit includes a resistance that is variable between two or more values. This variation operates to provide for the ability to alter the dynamic range of the diode detector by increasing the magnitude of the current flowing through that diode branch of the differential amplifier.

Thus, it is an object of the present invention to provide a method for controlling the output power of an RF power amplifier.

It is a further object of the present invention to provide a circuit that can detect and respond to slight fluctuations in the output power of an RF power amplifier or fluctuations in circuit parameters.

It is a further object of the present invention to provide a circuit that can accurately control the output power of an RF power amplifier, even in the presence of temperature fluctuations.

It is a further object of the present invention to provide a signal that is stable, in spite of variations in operating temperature, for controlling an RF power amplifier.

It is a further object of the present invention to provide a temperature independent circuit, for controlling the output of an RF power amplifier, that obviates the diode detectors of the prior art.

It is a further object of the present invention to provide an amplifying RF detector so as to reduce the number and/or gain of the stages needed after detection of the incoming RF signal.

Other objects, features, and advantages of the present invention will become apparent upon reading the following detailed description of the embodiments of the invention, when taken in conjunction with the accompanying drawings and appended claims.

BRIEF DESCRIPTION OF DRAWINGS

FIG. 2 is a functional block diagram of the present invention.

FIG. 3 is a schematic diagram of a differential RF detector/comparator constructed in accordance with the preferred embodiment of the present invention.

FIG. 4 is a schematic diagram of the differential RF detector/comparator of the present invention with a dynamic range control circuit.

DETAILED DESCRIPTION

Figure 1:
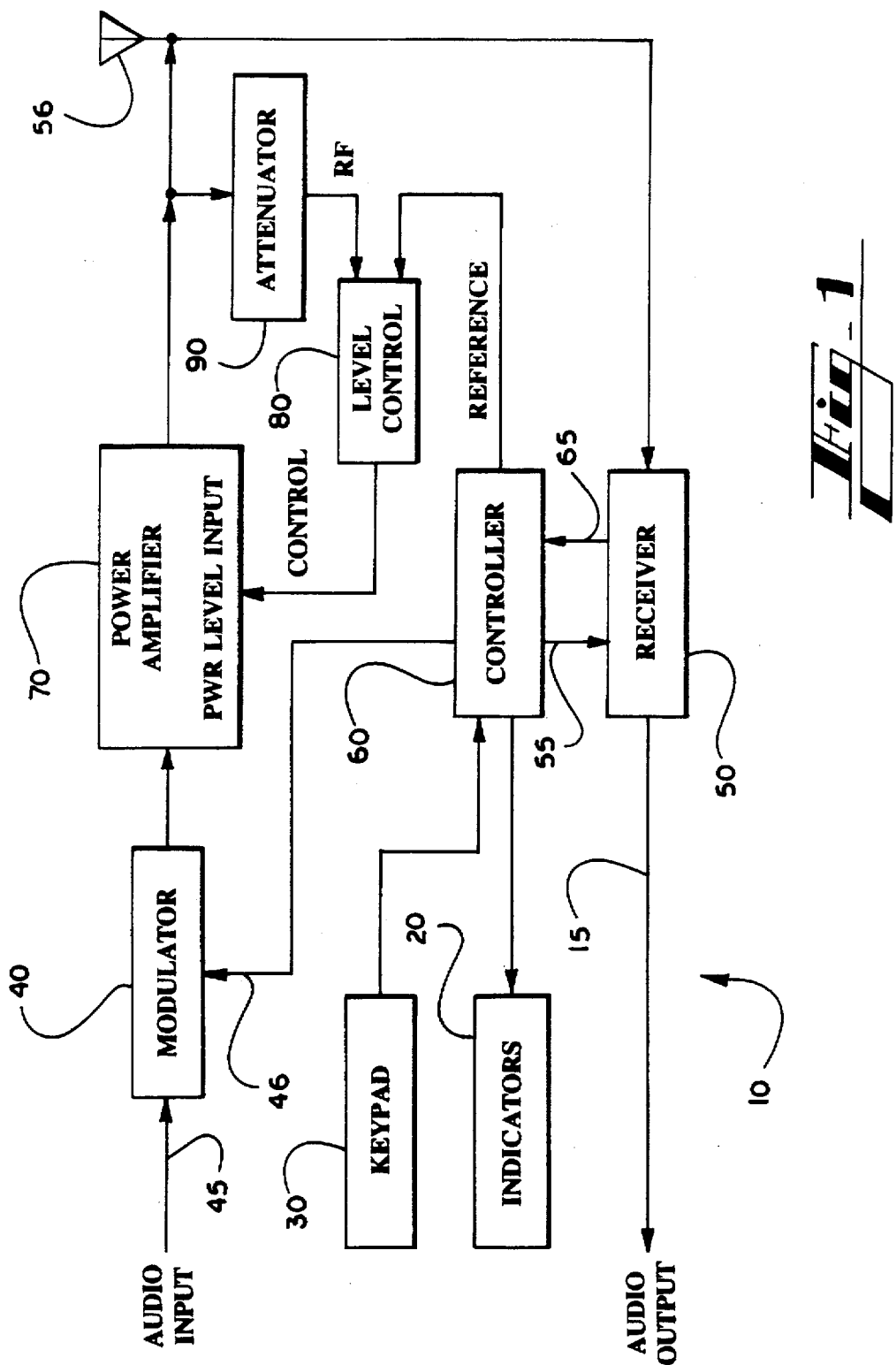
FIG. 1 is a block diagram of a radiotelephone incorporating the differential RF detector/comparator of the present invention.

Referring now in detail to the drawings, in which like numerals refer to like parts throughout the several views, FIG. 1 shows a block diagram of a cellular mobile radio telephone ("cellular telephone") that incorporates an automatic power level control circuit ("level control circuit") embodying the automatic output power control circuitry of the present invention. Although the present invention is described in conjunction with a cellular mobile radio telephone, those skilled in the art will understand that the present invention need not be so limited, and may find uses in communication systems of other types. The cellular telephone 10 includes a controller 60 which consists of a microprocessor, memory and other ancillary circuitry (not shown) needed to control the operation of the cellular telephone 10 such as a digital-to-analog converter so that controller 60 can generate an analog signal.

The controller 60 receives user inputs from a keypad 30. In addition to the digits constituting a telephone number to be called, the input from the keypad 30 may include data pertaining to the operation of the cellular telephone, such as volume control, storage of the telephone numbers, and the like. The controller 60 also is connected to indicators 20. These may include an alphanumeric display, other miscellaneous indicators, and tone generators.

RF signals received via antenna 56 are input to the receiver 50. The receiver 50 demodulates the RF signals and provides an audio output at point 15. The receiver 50 and controller 60 are functionally connected as indicated by signal paths 55 and 65. Commands indicating, among other things, the appropriate channel and power level are received from the host Mobile Telephone Switching Office (MTSO) (not shown) via antenna 56 and receiver 50 and are provided to the controller 60. Likewise, the controller 60 provides data to the receiver 50 indicating the proper channel selection so that the received signal will be properly tuned in and demodulated.

Audio input, such as speech, is received at point 45. This is provided to modulator 40 where a modulated signal is generated in accordance with the channel selection information provided to the modulator 40 by controller 60 via the connection indicated by arrow 46. The modulated signal is then provided to the power amplifier 70, where it is amplified to the specified power level and provided to the antenna 56.

As will be described more completely below, the level control circuit 80 provides a power level control signal that is used to control the output power provided by power amplifier 70. The level control circuit 80 receives a REFERENCE signal from the controller 60. The REFERENCE signal is indicative of the desired output power level. The level control circuit 80 also receives an RF signal corresponding to the output of the power amplifier 70. An attenuator 90 may be interposed between the output of the power amplifier 70 and the input of the level control circuit 80 to insure that the signal level is compatible with the allowable input voltage range of level control circuit 80. By comparing the REFERENCE signal with the actual RF output power level, the control circuit 80 provides a CONTROL signal to the power amplifier 70 that indicates whether the gain of the power amplifier 70, and therefore the output power level, needs to be increased or decreased in order to match the power level selected by controller 60.

Those skilled in the art will understand that the RF power amplifier in a cellular telephone is operated at one of a plurality of discrete power levels. The desired power level is selected by the microprocessor in controller 60 in response to signals received from the MTSO in the cellular telephone system in which the cellular telephone is operating. A digital-to-analog converter (not shown) in controller 60 converts a digital signal from the microprocessor into the analog REFERENCE signal that is used to control the output of the power amplifier 70 via level control circuit 80.

The analog REFERENCE signal, specified by the microprocessor, and the RF signal corresponding to the output of the power amplifier 70 are input into the level control circuit 80. A CONTROL signal is generated by detecting the RF signal and comparing the detected (rectified) RF signal to the REFERENCE signal. The output of the power amplifier 70 is then varied in response to the CONTROL signal until the RF signal corresponds to the RF power level specified by the REFERENCE signal. In this manner, the output of the power amplifier 70 follows the REFERENCE signal generated by the microprocessor.

FIG. 2 is a functional block diagram of the automatic power level control circuit 80 of the present invention. The power level control circuit 80 includes an RF detector 200, a level referencer 210, a current amplifier 220, and a current setting circuit 230. In addition, the automatic power level control circuit 80 has an RF signal input at point 100, a REFERENCE power select level input at point 110, and a power output CONTROL signal at point 120.

The RF detector 200, level referencer 210 and the current setting circuit 230, operate in conjunction as a differential amplifier to detect any difference between the RF input and the REFERENCE signals. Current setting circuit 230 establishes a tail current 235 which must be divided between the level referencer 210 and the RF Detector 200 branches of the differential amplifier. This tail current 235 is a constant current so any increase in current through the RF detector 200 will result in a decrease in current through the level referencer 210 and visa versa. For example, if the energy level of the RF input increases, the current through the RF detector 200 will increase and the current through the level referencer 210 will decrease. A steady state condition for this circuitry exists when the REFERENCE signal and the RF signal are both constant.

The error between the REFERENCE and the RF input signals is represented by output 225 from the level referencer 210. This output 225 is amplified by current amplifier 220 to generate the CONTROL signal 120 for the power amplifier 70.

FIG. 3 is a schematic diagram of a differential RF detector/comparator constructed in accordance with the preferred embodiment of the present invention. The RF detector 200 rectifies and averages the RF signal applied to input 100. A fixed voltage 102 applied to a voltage divider consisting of resistors 215 and 213 establishes a bias voltage value at node 209 for the diode detector circuitry. When the RF signal is more negative than the bias voltage, diode 202 is reversed biased and diode 204 is forward biased. During this time capacitor 208 charges through resistor 217. Capacitor 208 achieves its maximum charge when the RF input at 100 is at its most negative value with respect to the bias voltage at node 209. Then, as the RF input signal tends to a less negative value, the RF input signal adds to the voltage stored in the capacitor 208.

When the RF signal applied to input 100 and the voltage of capacitor 208 becomes more positive than the bias voltage at node 209, diode 204 is reversed biased and diode 202 is forward biased, allowing the signal to charge capacitors 206 and 214. The signal at terminal 100 then combines with the charge in capacitor 208 to provide a combined magnitude of the peak-to-peak voltage of the signal. This combined voltage is averaged by capacitors 206 and 214. After averaging, the voltage level at capacitors 206 and 214 closely approaches the average of the signal as if passed through a full wave rectifier.

This method for detecting the RF input signal is advantageous over the prior art in that the combined averaged voltage is larger than what is available through a standard half wave rectifier. This increase in the voltage level allows the circuitry to be more sensitive to changes in the RF signal or stated differently, the circuit can detect changes in the output signal more reliably.

Circuits 200, 210 and 230 are combined to function as a differential amplifier. Resistor 232 and the difference between the supply voltage VEE and emitter voltage VE establish the tail current 235 of the differential amplifier. In the instant invention, any of a plurality of voltage levels can be applied to the terminal 110 of circuitry 210 to set up a reference value for the transmitted RF signal. This voltage level drives the base of transistor 216 through a low pass filter 212. Thus, the voltage level applied to terminal 110 establishes the steady state current that will flow through the transistor 216 branch of the differential amplifier. Steady state is defined as the condition where a reference voltage is applied to terminal 110 of circuitry 210 and a constant power signal is applied to terminal 100 of circuitry 200 such that the tail current 235 is divided in a predetermined manner between circuitry 200 and 210.

The signal input at terminal 100 of the RF detector 200 is dependent upon the transmitted RF power. If the RF power increases, the signal level at terminal 100 of RF detector 200 increases and the current through the diode 202 and 204 branch of the differential amplifier increases. The tail current through resistor 232 remains constant so this increase will result in a decrease in current through the transistor 216 branch of the differential amplifier. The magnitude of the change in the current through transistor 216 will be amplified by current amplifier 220 via transistor 222. Thus, the decrease in transistor 216 current will result in a much larger decrease in current available at terminal 120 of current amplifier 220. The signal output from terminal 120 of current amplifier 220 is used to control the power amplifier 70 (shown in FIG. 1) and the change in the current drive of the signal at terminal 120 will result in a decrease in the output power from the power amplifier 70 (shown in FIG. 1).

If the RF power decreases, the signal at terminal 100 of RF detector 200 decreases and the current through the diodes 202 and 204 branch of the differential amplifier decreases. This results in an increase in the current through the transistor 216 branch of the differential amplifier. The magnitude of the change in the current through transistor 216 will be amplified by the current amplifier 220 via transistor 222. Thus, the increase in transistor 216 current will result in a larger increase in the current available at terminal 120 of current amplifier 220 and will result in an increase in the output power from the power amplifier.

If the reference voltage at terminal 110 of level referencer 210 is increased, the current through the transistor 216 branch of the differential amplifier increases. As described above, this will result in an increase in the output RF power. Likewise, if the reference voltage at terminal 110 of level referencer 210 decreases, the current through the transistor 216 branch of the differential amplifier decreases. Again, this will result in a decrease in the output RF power.

In summary, the voltage input at terminal 110 of level referencer 210 is used to select a steady state output RF power. When the output RF power begins to drift (either higher or lower), the RF detector 200 will respond accordingly and the drifting will result in a change in the drive current provided to power amplifier 70 via terminal 120. This feedback mechanism keeps the output power level constant for a given level reference.

The current setting circuit 230 can be used to change the dynamic range of the output power control circuitry. By varying the magnitude of the tail current, the dynamic range of the automatic output power control can be changed. If the tail current is increased, then the dynamic range of the circuitry increases and visa versa. FIG. 4 illustrates one method to implement this capability. A transistor 234 with input 126 varies the resistance of the tail portion of the differential amplifier. When input 126 is more positive than supply voltage VEE, transistor 234 begins to conduct current causing the effective resistance of current setting circuit 230 to decrease. This decrease in effective resistance results in an increase in the tail current 235.

FIG. 4 illustrates an alternative embodiment of the present invention. FIG. 4 replaces the diode 204 of FIG. 3 with an isolator 205. Although the isolator 205 can consist of a single diode, it is not limited as such. Thus, a resistor or inductor could also be used to isolate the detected RF signal from the biasing circuit at node 209. In this configuration, the averaged voltage at capacitors 206 and 214 will closely approach the average of the RF signal as if passed through a half wave rectifier. The value of this averaged voltage will be proportional to the magnitude of the RF output power.

Figure 5:
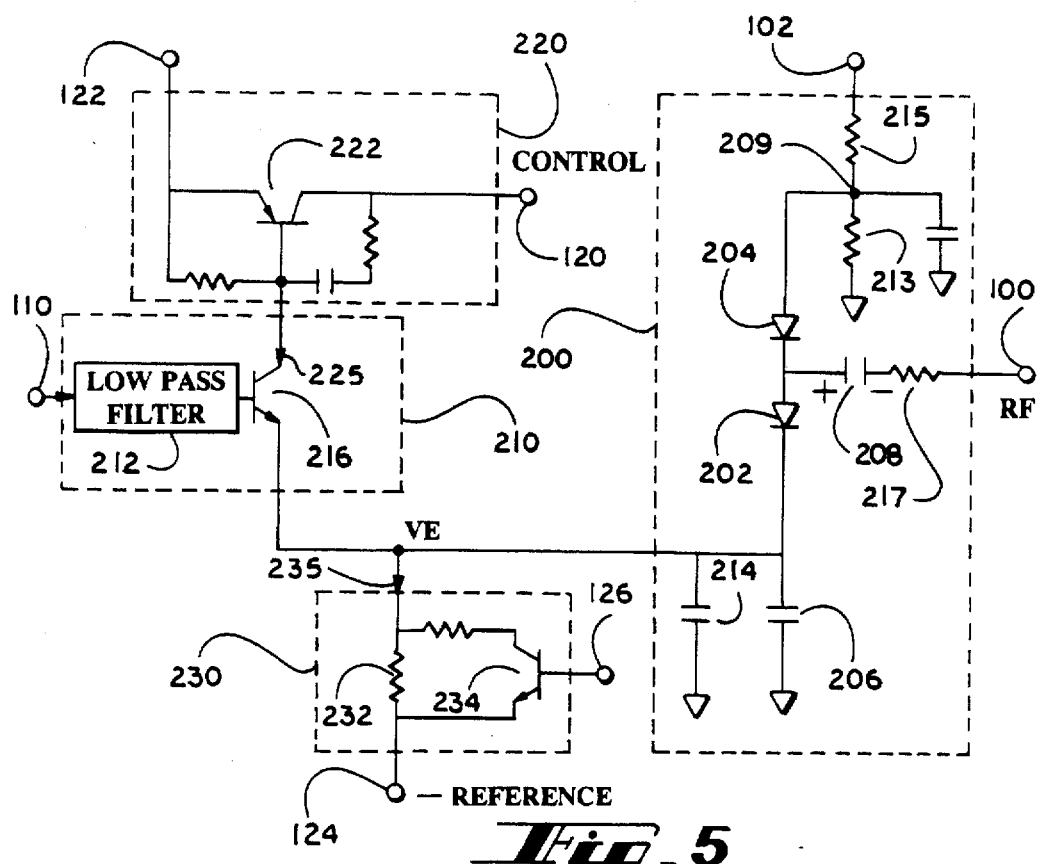
FIG. 5 is a schematic diagram of an alternative embodiment of the differential RF detector/comparator of the present invention.

FIG. 5 shows an alternative embodiment. The reference voltage is inverted and applied to input 124 of current setting circuit 230, and the input 110 of level referencer 210 is tied to a constant voltage. "Inverted" means that a more positive control signal indicates that the output power should be reduced. As the reference voltage at terminal 130 of range adjustment 230 becomes more negative, the tail current increases and hence the current through transistor 216 increases. This will again result in an increase in the output power level. This embodiment allows for the dynamic range of the automatic output control circuitry to change in proportion to the desired output RF power.

Figure 6:
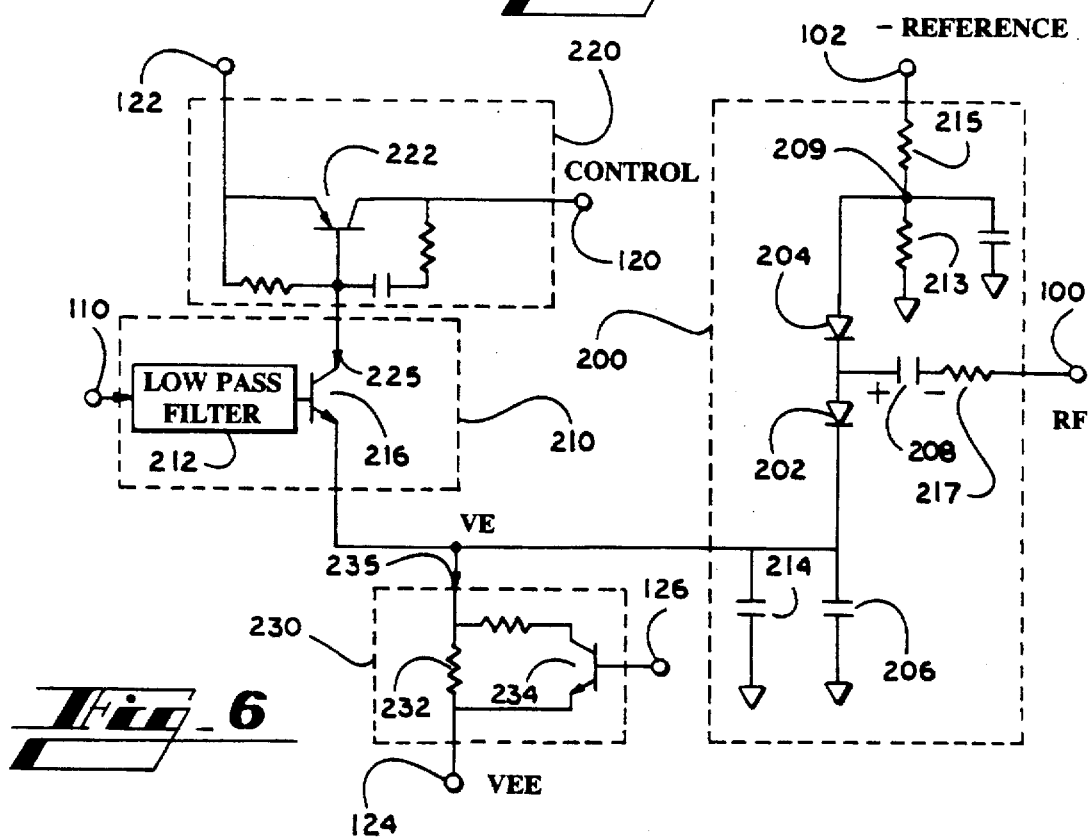
FIG. 6 is a schematic diagram of another alternative embodiment of the differential RF detector/comparator of the present invention.

FIG. 6 shows another alternative embodiment. The reference voltage is inverted and applied to input 102 of RF detector 200. Input 110 of level referencer 210 is tied to a constant value. As the reference voltage at terminal 102 increases, VE increases and the tail current 235 increases. But, the transistor 216 current 225 decreases and results in a decrease in the output power level of the RF signal. Similarly, a decrease in the reference voltage will result in increasing the output power level of the RF signal.

While this invention has been described in detail with particular reference to preferred embodiments thereof, it will be understood that variations and modifications can be effected within the spirit and scope of the invention as described herein before and as defined in the appended claims.

I claim:

1. A circuit for providing an output control signal based on an input signal, comprising:

a first diode having an anode and a cathode, said anode of said first diode being functionally connected to an input signal source;

a second diode having an anode and a cathode, said cathode being functionally connected to said input signal source, said anode being functionally connected to a first DC voltage source;

a first transistor having a base, an emitter, and a collector, said base of said first transistor being connected to a reference signal, said emitter of said first transistor being connected to said cathode of said first diode, and said collector of said first transistor providing said output control signal;

a first capacitor; and a current setting circuit for setting the current provided to said first transistor and said first diode, comprising a first terminal connected to said emitter of said first transistor, said cathode of said first diode, and said first capacitor, and a second terminal connected to a second DC voltage source.

2. The circuit of claim 1, further comprising a second capacitor being interposed between said first diode and said input signal source, being connected at a first end to said anode of said first diode and said cathode of said second diode, and being functionally connected at a second end to said input signal source.

3. A circuit for detecting and controlling the output level of a signal amplifier, comprising:

a first diode having an anode and a cathode, said anode of said first diode being functionally connected to an output of said signal amplifier;

a second diode having an anode and a cathode, said cathode being functionally connected to said output of said signal amplifier, said anode being functionally connected to a first DC voltage source;

a first transistor having a base, an emitter, and a collector, said base of said first transistor being connected to a second DC voltage source, said emitter of said first transistor being connected to said cathode of said first diode, and said collector of said first transistor providing a output level control signal;

a first capacitor; and a current setting circuit for setting the current provided to said first transistor and said first diode, comprising a first terminal connected to said emitter of said first transistor, said cathode of said first diode, and said first capacitor, and a second terminal being connected to a reference signal.

4. The circuit of claim 3, further comprising a second capacitor being interposed between said first diode and said signal amplifier, being connected at a first end to said anode of said first diode and said said cathode of said second diode, and being functionally connected at a second end to said signal amplifier.

5. A circuit for detecting and controlling the output power of a radio frequency (RF) amplifier, comprising:

a first diode having an anode and a cathode, said anode of said first diode being functionally connected to an output of said RF amplifier;

a second diode having an anode and a cathode, said cathode being functionally connected to said output of said RF amplifier, said anode being functionally connected to a reference signal;

a first transistor having a base, an emitter, and a collector, said base of said first transistor being connected to a first DC voltage source, said emitter of said first transistor being connected to said cathode of said first diode, and said collector of said first transistor providing a power level control signal;

a first capacitor; and a current setting circuit for setting the current provided to said first transistor and said first diode, comprising a first terminal connected to said emitter of said first transistor, said cathode of said first diode, and said first capacitor, and a second terminal being connected to a second DC voltage source.

6. The circuit of claim 5, further comprising a second capacitor being interposed between said first diode and said RF amplifier, being connected at a first end to said anode of said first diode and said cathode of said second diode, and being functionally connected at a second end to said output of said RF amplifier.

7. A circuit for maintaining the output power of a transmitter by providing an output power control signal to said transmitter, comprising:

an RF detector for receiving an output power signal, storing the magnitude of said output power signal when said output power signal is more negative than a DC bias voltage, generating a variable signal by adding said stored magnitude to said output power signal when said output power signal is more positive than said DC bias voltage, and averaging said variable signal to provide an averaged variable signal;

a current setting circuit for establishing a predetermined current; and an output power level reference circuit responsive to said predetermined current and said averaged variable signal for providing said output power control signal.

8. A method for providing a control signal to automatically adjust an output power of a radio frequency (RF) amplifier, comprising the steps of:

detecting said output power and comparing said detected output power to a DC bias voltage;

storing the magnitude of said detected output power level when said output power is more negative than said DC bias voltage;

generating a combined variable signal by adding said stored magnitude to said detected output power level when said output power is more positive than said DC bias voltage;

averaging said combined variable signal to produce a DC voltage corresponding to said output power; and comparing said DC voltage to a reference voltage to generate a control signal for adjusting said output power of said RF amplifier.

* * * * *